US012027900B1

(12) United States Patent
Prasad et al.

(10) Patent No.: US 12,027,900 B1
(45) Date of Patent: Jul. 2, 2024

(54) VEHICLE BATTERY SYSTEMS INCLUDING DC-DC CONVERTERS

(71) Applicant: GM GLOBAL TECHNOLOGY OPERATIONS LLC, Detroit, MI (US)

(72) Inventors: Rashmi Prasad, Troy, MI (US); Mohamed Ahmed Kamel Ahmed, Birmingham, MI (US); Chandra S. Namuduri, Troy, MI (US); Jun-mo Kang, Ann Arbor, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 49 days.

(21) Appl. No.: 18/096,592

(22) Filed: Jan. 13, 2023

(51) Int. Cl.
*H02J 7/00* (2006.01)
*B60L 50/60* (2019.01)
*H02M 3/00* (2006.01)
*H05K 7/20* (2006.01)

(52) U.S. Cl.
CPC ............ *H02J 7/0063* (2013.01); *B60L 50/60* (2019.02); *H02M 3/003* (2021.05); *H05K 7/20845* (2013.01); *B60L 2210/10* (2013.01); *H02J 2207/20* (2020.01)

(58) Field of Classification Search
CPC ..... H02J 7/0063; H02J 2207/20; B60L 50/60; B60L 2210/10; H02M 3/003; H05K 7/20845
USPC ....................................................... 307/10.1
See application file for complete search history.

(56) References Cited

U.S. PATENT DOCUMENTS

| | | | |
|---|---|---|---|
| 8,115,446 B2* | 2/2012 | Piccard | H02J 7/342 320/128 |
| 10,131,245 B2 | 11/2018 | Hand, III et al. | |
| 10,298,026 B2 | 5/2019 | Trimboli et al. | |
| 10,804,809 B1 | 10/2020 | Yelaverthi et al. | |
| 2014/0312844 A1* | 10/2014 | Mercier | B60L 58/12 320/118 |
| 2015/0137736 A1* | 5/2015 | Lucea | H02J 7/0018 320/103 |
| 2016/0006276 A1* | 1/2016 | Mikulec | H02J 7/0014 307/19 |

OTHER PUBLICATIONS

U.S. Appl. No. 17/839,769, filed Jun. 14, 2022, Kamel et al.

* cited by examiner

*Primary Examiner* — Alfonso Perez Borroto

(57) ABSTRACT

A battery system for a vehicle includes multiple battery cells each configured to store charge for powering an electric vehicle, a high voltage bus electrically coupled with the multiple battery cells to provide power to an electric motor, and multiple cell monitoring modules each coupled with a corresponding one of the multiple battery cells, each cell monitoring module including a controller configured to monitor operation parameters of the corresponding one of the multiple battery cells. The system includes multiple DC-DC converters in a converter housing, each DC-DC converter electrically coupled with a corresponding one of the multiple battery cells outside of the converter housing, and a low voltage bus electrically connected between the multiple DC-DC converters in the converter housing and at least one vehicle electrical component outside of the converter housing. The low voltage bus is configured to provide low voltage power to at least one vehicle electrical component.

20 Claims, 6 Drawing Sheets

VEHICLE BATTERY SYSTEMS INCLUDING DC-DC CONVERTERS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure generally relates to vehicle battery systems including DC-DC converters, and more particularly, to DC-DC converters coupled between battery cells and a low voltage bus.

SUMMARY

A battery system for a vehicle includes multiple battery cells each configured to store charge for powering an electric vehicle, a high voltage bus electrically coupled with the multiple battery cells to provide power to an electric motor of the electric vehicle, multiple cell monitoring modules each coupled with a corresponding one of the multiple battery cells, each cell monitoring module including a controller configured to monitor operation parameters of the corresponding one of the multiple battery cells, a converter housing, multiple DC-DC converters in the converter housing, each DC-DC converter electrically coupled with a corresponding one of the multiple battery cells outside of the converter housing, and a low voltage bus electrically connected between the multiple DC-DC converters in the converter housing and at least one vehicle electrical component outside of the converter housing, the low voltage bus configured to provide low voltage power to at least one vehicle electrical component.

In other features, the converter housing is a first converter housing, the low voltage bus is a first low voltage bus, and the multiple DC-DC converters are first DC-DC converters, and the battery system further includes a second converter housing, a second DC-DC converters in the second converter housing, each second DC-DC converter electrically coupled with a corresponding one of the multiple battery cells outside of the second converter housing, and a second low voltage bus electrically connected between the second DC-DC converters in the second converter housing and at least one vehicle electrical component outside of the second converter housing, the second low voltage bus configured to provide low voltage power to at least one vehicle electrical component.

In other features, the first low voltage bus is configured to connect to a different low voltage grid of the electric vehicle than the second low voltage bus, and a voltage of the low voltage power provided by the first low voltage bus is different than a voltage of the low voltage power provided by the second low voltage bus.

In other features, the voltage of the low voltage power provided by the first low voltage bus is forty-eight volts, and the voltage of the low voltage power provided by the first low voltage bus is twelve volts.

In other features, the low voltage bus is a first low voltage bus, and the multiple DC-DC converters are first DC-DC converters, and the battery system further includes second DC-DC converters in the converter housing, each second DC-DC converter electrically coupled with a corresponding one of the multiple battery cells outside of the converter housing, and a second low voltage bus electrically connected between the second DC-DC converters and at least one vehicle electrical component, the second low voltage bus configured to provide low voltage power to at least one vehicle electrical component.

In other features, a topology of the first DC-DC converters is different than a topology of the second DC-DC converters.

In other features, a voltage of power provided by the high voltage bus is greater than or equal to sixty volts, and a voltage of provided by the low voltage bus is less than one quarter of the voltage of the high voltage bus.

In other features, the system includes multiple electrical input wires, wherein each of the multiple electrical input wires is electrically connected between one or more of the multiple battery cells and a corresponding one of the multiple DC-DC converters in the converter housing.

In other features, at least two of the multiple DC-DC converters are electrically connected in series to the low voltage bus.

In other features, at least two of the multiple DC-DC converters are electrically connected in parallel to the low voltage bus.

In other features, the system includes a communication bus coupled between the multiple DC-DC converters to coordinate power sharing between the multiple DC-DC converters.

In other features, the system includes at least one thermal management module in the converter housing, wherein the at least one thermal management module is configured to adjust a temperature of at least one of an interior of the converter housing or the multiple DC-DC converters.

A battery system for a vehicle includes multiple battery cells each configured to store charge for powering an electric vehicle, a high voltage bus electrically coupled with the multiple battery cells to provide power to an electric motor of the electric vehicle, multiple DC-DC converters, each DC-DC converter electrically coupled with a corresponding one of the multiple battery cells, a low voltage bus configured to provide low voltage power to at least one electrical component of the electric vehicle, each of the multiple DC-DC converters electrically coupled with the low voltage bus, and multiple cell monitoring modules each coupled with a corresponding one of the multiple battery cells, each cell monitoring module including a controller configured to monitor operation parameters of the corresponding one of the multiple battery cells.

In other features, the low voltage bus is a first low voltage bus, and the multiple DC-DC converters are first DC-DC converters, and the battery system further includes second DC-DC converters each electrically coupled with a corresponding one of the multiple battery cells, and a second low voltage bus electrically connected between the second DC-DC converters and at least one vehicle electrical component, the second low voltage bus configured to provide low voltage power to at least one vehicle electrical component.

In other features, at least two of the multiple DC-DC converters are electrically connected in series to the low voltage bus.

In other features, at least two of the multiple DC-DC converters are electrically connected in parallel to the low voltage bus.

In other features, the low voltage bus includes at least one of a bus bar or a cable.

In other features, each controller is configured to control operation a corresponding one of the multiple DC-DC converters.

In other features, the system includes a communication bus coupled between the multiple DC-DC converters to coordinate power sharing between the multiple DC-DC converters.

In other features, each DC/DC converter includes a converter control circuit, each converter control circuit is on a same printed circuit board as the controller of a corresponding cell monitoring module, and each printed circuit board includes at least one of a planar magnetic core and at least one high frequency switching element.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
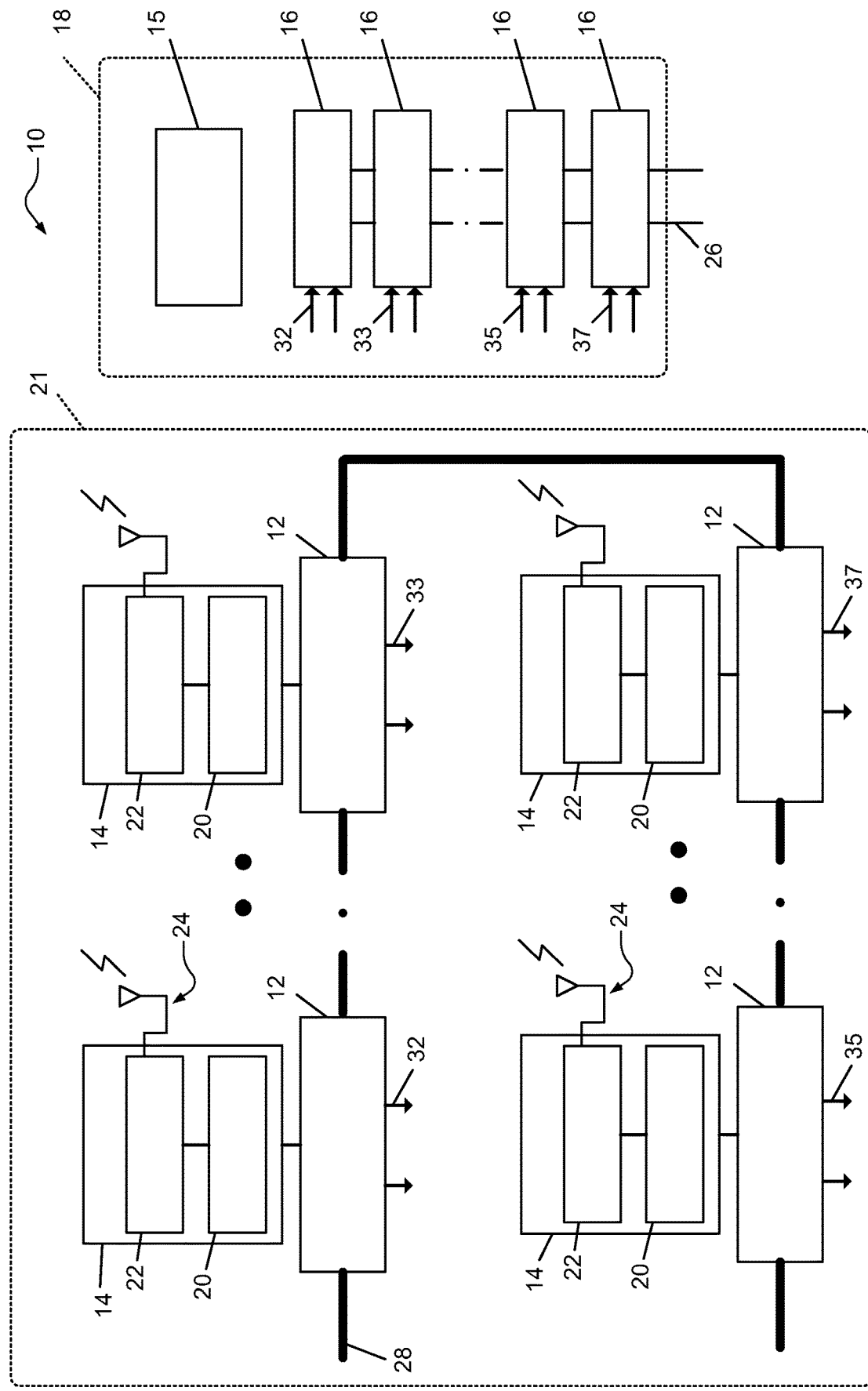
FIG. 1 is a block diagram illustrating an example vehicle battery system including DC/DC converters electrically connected with a low voltage bus.

While battery cell systems with DC/DC converters are described herein in the context of EVs, the battery cell systems can be used in stationary applications and/or in other applications.

Some example embodiments may allow for direct current to direct current (DC-DC) converters (such as unidirectional/bidirectional, buck, isolated buck, boost, isolated boost, isolated buck-boost, dual active bridge, push-pull or similar converters), to be integrated into a rechargeable energy storage system (RESS), such as a battery system of an electric vehicle including multiple battery cells. The DC/DC converters may support a low voltage bus of the vehicle, and facilitate controlled power sharing between groups of battery cells.

In various implementations, each DC/DC converter may be integrated with a corresponding battery cell/module, and/or DC/DC converters may be placed together in a central converter housing that groups all distributed DC/DC converters together for sharing load power.

For example, a converter housing (e.g., a centralized converter enclosure) may house multiple unidirectional and/or bidirectional DC/DC converters, such that input wires from each battery cell are connected to a corresponding DC/DC converter in the converter housing as an input. A parallel output (or serial output) of the DC/DC converters may be fed into a single low voltage system bus (e.g., a low voltage bus for providing low voltage power to one or more vehicle components that operate on low voltage power), or multiple low voltage buses. The low voltage bus may operate at any suitable low voltage value, such as about 48 volts, about 24 volts, about 12 volts, about 5 volts, about 3.3 volts, etc. In some examples, the serial output of the DC/DC converters can achieve voltages higher than 48 volts. The low voltage bus may have a voltage of less than one quarter of a voltage of the high voltage bus.

In some example embodiments with multiple low voltage grids, a separate converter housing may be used for each group of DC/DC converters outputting a different low voltage value. For example, DC/DC converters outputting power to a 48V bus may be in a different converter housing than DC/DC converters outputting power to a 12V bus.

In various implementations, a single enclosure may be used for different groups of DC/DC converters. For example, a group of DC/DC converters outputting power to a 48V bus may be in a same housing as a group of DC/DC converters outputting power to a 12V bus. DC/DC converters on a same low voltage grid may have a same converter topology and power rating. In some examples, DC/DC converters on different low voltage grids may have different converter topologies and power ratings.

In another example embodiment, each of multiple isolated DC/DC converters may be integrated onto a corresponding one of multiple battery cells, via integration with a cell monitor of the battery cell. This may increase power density of the system, and increase precision of parameter sensing at the battery cell/module level.

The DC/DC converter may be integrated with the system as a separate component, or may be fully integrated as a power integrated circuit/microcontroller DC/DC converter, for a low cost solution. Sensing and monitoring circuits may be external to the integrated circuit for compact packaging.

In some examples, each isolated DC/DC converter may be fully encapsulated, with outputs that are parallel connected to a voltage bus (or serially connected). For example, a package may include a DC/DC converter circuit which has high frequency switching elements (e.g., metal-oxide semiconductor field-effect transistors (MOSFETs), other transistors, other switching devices, etc.), along with a high frequency transformer and inductors, gate drivers, precision sensors, bias power supplies, etc. These components may be encapsulated together and mounted on a printed circuit board (PCB), along with a heat sink at the bottom of the converter package for maximum heat dissipation.

In various implementations, each DC/DC converter may be regulated using small, symmetric distributed wiring, and with communication bussing from each battery cell/module. This may facilitate synchronization of the DC/DC converters, to allow dynamic sharing of load power (e.g., equal power at each DC/DC converter output).

In some examples, such as systems having different low voltage buses/grids, different packing schemes for the DC/DC converters may be used in the same system. For example, DC/DC converters providing power to a 48V bus may be located together in a converter housing, while DC/DC converters providing power to a 12V bus may each be located at a corresponding battery cell.

Thermal management of the DC/DC converters may be distributed based on the locations of the DC/DC converters. For example, when the DC/DC converters are each located at a different battery cell, each DC/DC converter may have its own heat sink, may use heat management modules of the battery cell where the DC/DC converter is located, etc.

When DC/DC converters are located in a converter housing, a central thermal management module may be located in the housing with the DC/DC converters (which may use a central coolant path for the converter housing, etc.).

As mentioned above, a centralized converter box may house multiple unidirectional and/or bidirectional DC-DC converters, with input wires from each battery module/cell connected to the converter box as inputs to the DC-DC converters. The parallel (or serial) output of the multiple DC-DC converters in the converter housing may then be fed to a single low voltage system bus, multiple low voltage system buses, etc.

Separate converter housings may be used for each group of DC-DC converters that are connected to a different low voltage grid of the system, or a single enclosure may be used to house all DC-DC converters for multiple low voltage grids. DC-DC converters within a same low voltage grid may have same topology and power rating. DC-DC converters of different low voltage grids may have different (or same) converter topologies and power ratings.

In various implementations, a DC-DC converter may be interfaced with a battery cell on a same printed circuit board, with planar/flat magnetic components. Outputs may be aggregated from single cells or multiple battery cells connected in series, and cell monitors for each group of battery cells may be used to increase the precisions level of sensing battery cell parameters (such as current, voltage, temperature, power, etc.).

The outputs of DC-DC converters may be connected in any suitable manner. For example, the outputs may be connected in parallel to an isolated low voltage bus, may be connected in series to an isolated low voltage bus, may be connected in series to an isolated high voltage bus, etc. The outputs of the DC-DC converters may be connected in series at an aggregated voltage of multiple battery cells. In various implementations, only some of the DC-DC converters may be connected in series, while others are not connected in series.

In various implementations, battery cell monitoring function(s) and DC/DC converter control circuits may be packaged in, for example, the same integrated circuit. For example, circuits and components of a cell monitor controller, and a DC/DC converter controller, may be packaged in the same integrated circuit. A single controller may operate both the battery cell monitoring functions and the DC/DC converter control function. In some cases, the battery cell monitoring function(s) and the DC/DC converter control function may be packaged in separate integrated circuits.

In some examples, a DC-DC converter control circuit (e.g., a controller of the DC/DC converter) may be configured to control operation of a cell monitoring circuit (e.g., a cell monitor unit (CMU) as described further below). The cell monitoring circuit (e.g., a controller of a CMU) may be configured to control operation of the DC-DC converter.

Output of the DC-DC converters may be coupled to the low voltage bus in any suitable manner. For example, the low voltage bus bar may include a shared bus bar structure that is electrically coupled with outputs of the DC-DC converters, a shared cable that is electrically connected with outputs of the DC-DC converters, etc.

In some example embodiments, such as a single isolated DC/DC converter with a plurality of battery cells, the cell monitoring circuitry and DC/DC converter may be implemented together in a single printed circuit board with planar magnetic cores, with power switching converters such as switched capacitor converters, forward converters, push-pull converters, etc.

In various implementations, an isolated low voltage bus may have a high current (e.g., of 100 A or more). The low voltage bus may have a thick wire for carrying high current. Cooling may be shared with thermal management components (e.g., heat sinks, etc.) of a battery cell, where the low voltage bus does not use high power.

Each DC-DC converter may be fully encapsulated, where switching elements of the converter, transformers, etc., are housed in the DC-DC converter. Symmetric wiring and communication busing may be connected between different DC-DC converters, to regulate the converters, provide power sharing, etc. For example, in some cases it may be desirable to have equal or substantially equal power between multiple DC-DC converters, so using wiring that has symmetric resistance for one low voltage bus, or over different buses, may simplify equal power sharing.

In some example embodiments, each battery cell module may have a smaller voltage than the entire stack of battery cells in series (e.g., a smaller voltage than the total high voltage output to an electric motor by a series of battery cells), but each battery cell module may have a high voltage relative to ground. Each module has a smaller voltage than the entire stack, but could still be high relative to ground Thermal management of the DC-DC converters may be shared with existing battery cell cooling components, such as a single plate connected to a common core plate for the battery cell module. For example, a heat spreader may connect to a heat sink of a battery cell module. In other examples, dedicated cooling may be implemented when multiple DC-DC converters are combined, such as multiple DC-DC converters in a converter housing.

The DC-DC converter housing may be part of a rechargeable energy storage system, such as in the same area of the vehicle as a rechargeable energy storage system, etc. In other embodiments, the DC-DC converter housing may be located separately from the rechargeable energy storage system.

FIG. 1 is a block diagram illustrating an example of a vehicle battery system 10 including DC/DC converters 16 electrically connected with a low voltage bus 26. As shown in FIG. 1, a rechargeable energy storage system 21 for a vehicle (such as an electric vehicle), includes multiple battery cell modules 12.

The battery cell modules 12 are electrically connected with a high voltage bus 28. The high voltage bus 28 may be configured to supply high voltage power to a component of the vehicle, such as an electric motor. The high voltage may have any suitable voltage value, such as greater than or equal to 60V, greater than or equal to 300V, greater than or equal to 400V, greater than or equal to 800V, etc. As shown in FIG. 1, the battery cell modules 12 are connected together in series. In other embodiments, the battery cell modules 12 may be connected in parallel, or any other suitable connection arrangement.

A cell monitor 14 (e.g., CMU) is coupled with (e.g., integrated with) each battery cell module 12. The cell monitor 14 may be configured to monitor operating parameters of the battery cell module 12, such as a voltage of the battery cell module, a temperature of the battery cell module, a current of the battery cell module, a power of the battery cell module, etc.

The cell monitor 14 includes a controller 20. The controller 20 may be configured to control operation of the cell monitor 14, of the battery cell module 12, of a DC/DC converter 16, etc. For example, the controller 20 may be configured to execute computer-executable instructions that are accessible to the controller 20, stored with the controller 20, etc.

The cell monitor 14 also includes a transmitter 22, and an antenna 24. The cell monitor 14 may be configured to wirelessly transmit operating parameters of the battery cell module 12 to a central controller, for monitoring of multiple battery cell modules 12 at the central controller.

The vehicle battery system 10 also includes a converter housing 18. The DC/DC converters 16 are housed in the converter housing 18. For example, a central container box, etc., may be used to contain multiple DC/DC converters 16 in one location. The outputs of the DC/DC converters are electrically coupled with a low voltage bus 26.

For example, as shown in FIG. 1, the DC/DC converters 16 may be connected in series with the low voltage bus 26. In other embodiments, the DC/DC converters 16 may be connected in parallel with the low voltage bus 26 (or any other suitable connection arrangement).

The low voltage bus 26 may be configured to supply power to vehicle electric components that operate on lower voltages. For example, the low voltage bus 26 may supply power at a voltage of less than or equal to about 3.3V, less than or equal to about 5V, less than or equal to about 12V, less than or equal to about 24V, less than or equal to about 48V, etc.

In the example of FIG. 1, each battery cell module 12 is wired to a corresponding one of the DC/DC converters 16. For example, a higher voltage of the battery cell module 12 may be wired as an input to a corresponding one of the DC/DC converters 16 in the converter housing 18, where the DC/DC converter 16 is configured to convert the voltage to a low voltage output for the low voltage bus 26.

As shown in FIG. 1, each battery cell module 12 includes a wire 32, 33, 35 or 37, which provides power to a corresponding one of the DC/DC converters 16. Although FIG. 1 illustrates four battery cell modules and four DC/DC converters, other embodiments may include more or less battery cell modules and DC/DC converters 16.

There may or may not be a one-to-one correspondence between the battery cell modules 12 and the DC/DC converters 16. For example, a DC/DC converter 16 may receive inputs from more than one battery cell module 12, multiple DC/DC converters 16 may be supplied by a single battery cell module, etc. In various implementations, there may be one DC/DC converter 16 across each battery cell, not just a battery module.

The converter housing 18 may include a thermal management module 15. For example, a heat sink, liquid cooling system, etc., may be implemented in the converter housing to provide cooling for the DC/DC converters 16. Each DC/DC converter 16 may include its own heat sink or other cooling component, and the converter housing 18 may include multiple thermal management modules 15 spread throughout the converter housing 18, depending on a heat load of the DC/DC converters.

In some example embodiments, there may be communication buses, etc., between the DC/DC converters 16 (such as the example illustrated in FIG. 5 and discussed further below). The communication bus(es) may allow the DC/DC converters 16 to perform dynamic power control, to maintain an equal or substantially equal power processed within each DC/DC converter.

Figure 2:
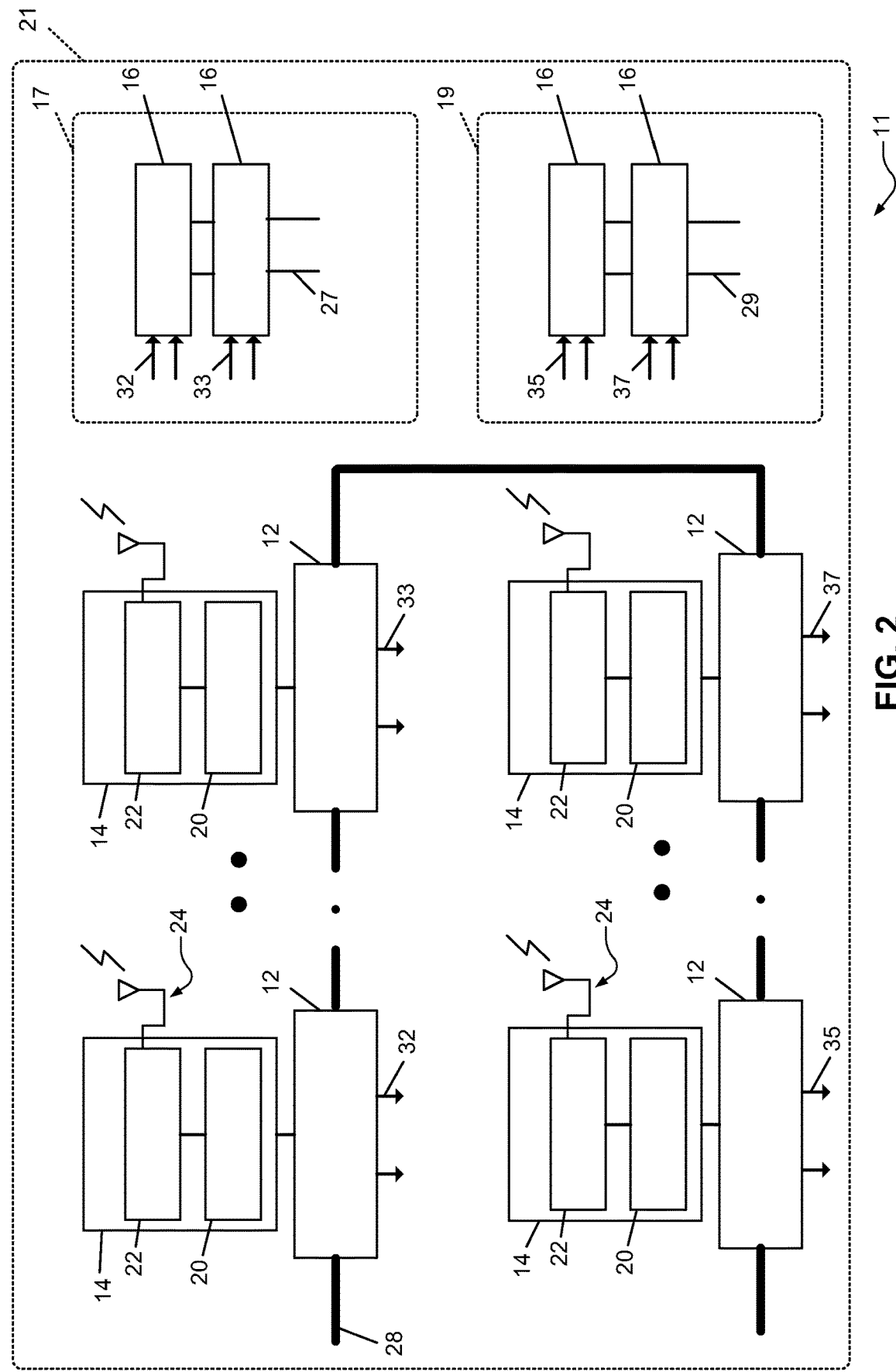
FIG. 2 is a block diagram illustrating an example vehicle battery system including DC/DC converters in separate converter housings.

FIG. 2 is a block diagram illustrating an example of a vehicle battery system 11 including DC/DC converters 16 in separate converter housings. The vehicle battery system 11 of FIG. 2 may be similar to the vehicle battery system 10 of FIG. 1, but with multiple converter housings. In particular, FIG. 2 illustrates a first converter housing 17 and a second converter housing 19.

In particular, the first converter housing 17 includes two DC/DC converters 16 coupled with a first low voltage bus 27. The second converter housing 19 includes two DC/DC converters 16 electrically coupled with a second low voltage bus 29. As should be apparent, in other embodiments there may be more or less converter housings, converter housings with more or less DC/DC converters, etc.

The DC/DC converters in the different housings may be configured to output different voltages. For example, the DC/DC converters 16 in the first converter housing 17 may be configured to output a voltage of 48V on the first low voltage bus 27. The DC/DC converters 16 in the second converter housing 19 may be configured to output a voltage of 24V on the second low voltage bus 29. The DC/DC converters 16 in the first converter housing 17 may have a different converter topology, etc., compared to the DC/DC converters 16 in the second converter housing 19, to output a different voltage.

FIG. 2 illustrates the first converter housing 17 and the second converter housing 19 as being part of the rechargeable energy storage system 21. In other embodiments, the converter housings may be separate from the rechargeable energy storage system 21.

Figure 3:
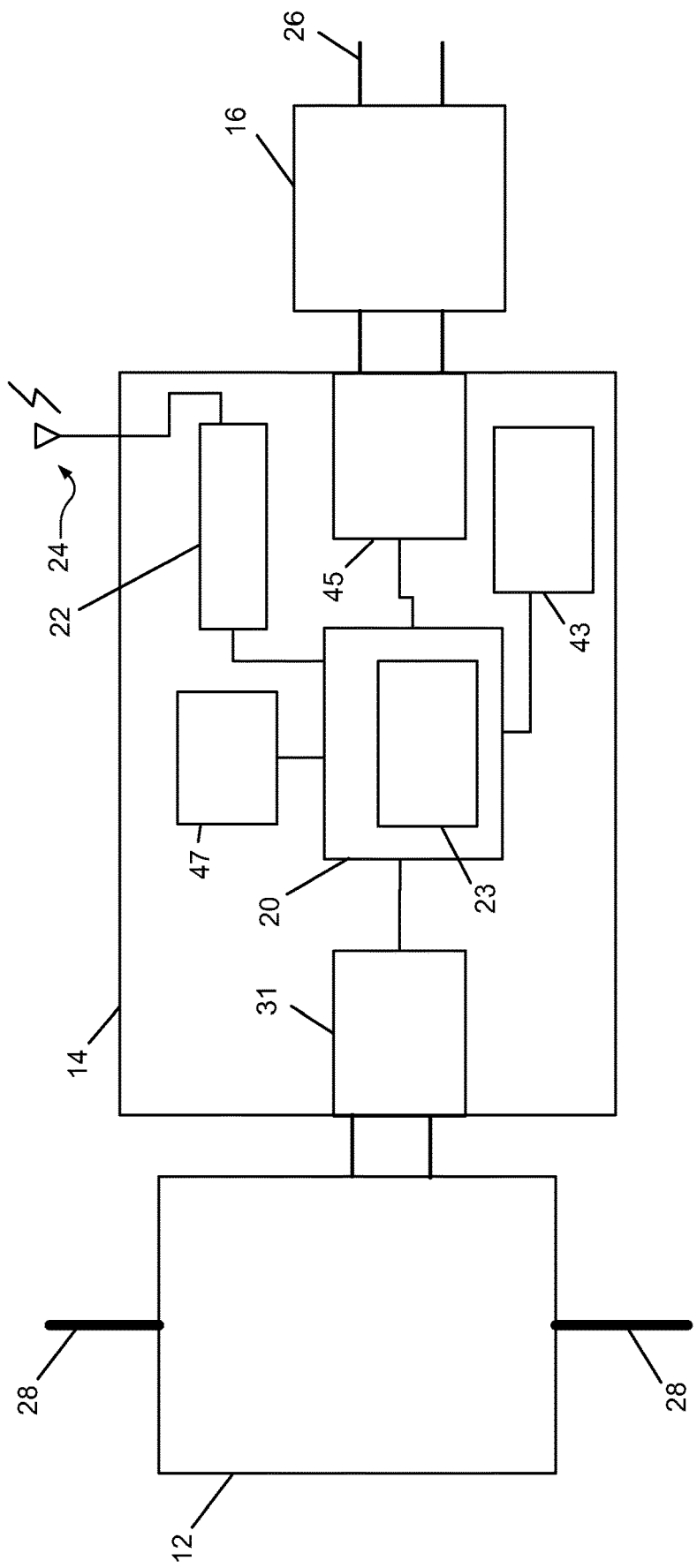
FIG. 3 is a block diagram illustrating a cell monitor coupled with a battery cell module.

FIG. 3 is a block diagram illustrating a cell monitor 14 coupled with a battery cell module 12. As shown in FIG. 3, the battery cell module 12 is coupled with the high voltage bus 28. The cell monitor 14 is illustrated as coupled between the battery cell module 12 and the DC/DC converter 16. In other embodiments, the DC/DC converter 16 may be directly coupled to the battery cell module, etc.

The cell monitor includes a cell module interface 31. The cell module interface 31 is configured to interface with the battery cell module 12 (e.g., via one or more terminals, wires, electrical connections, etc.), to obtain information about parameters of the battery cell module 12. For example, the cell module interface 31 may sense or detect a voltage of the battery cell module 12, a current of the battery cell module 12, a power of the battery cell module 12, a temperature of the battery cell module 12, etc.

The cell module interface 31 may be configured to receive power from the battery cell module 12, in order to supply power to the DC/DC converter 16. For example, the cell monitor 14 includes a DC/DC converter interface 45 for, e.g., supplying power to the DC/DC converter 16, sensing operating parameters of the DC/DC converter 16, controlling the DC/DC converter 16, etc. The DC/DC converter 16 is configured to prove low voltage power to the low voltage bus 26.

The cell monitor 14 includes the controller 20. The controller 20 includes a converter control module 23, which may be stored with the controller 20, accessed from another memory, etc. The controller 20 may be configured to control operation of the cell monitor 14, of the DC/DC converter 16, of the battery cell module 12, etc., based on computer-executable instructions of the converter control module 23.

The cell monitor 14 also includes a bias power source module 47 configured to provide bias power to the controller 20, and a signal conditioning module 43. The signal conditioning module 43 may be configured to perform signal processing on signals received by the cell monitor 14, transmitted by the cell monitor 14, processed by the cell monitor 44, etc.

As mentioned above, the cell monitor 14 includes a transmitter 22 coupled with an antenna 24. The controller 20 may be configured to transmit operation parameters of the battery cell module 12 to a central controller, via the transmitter 22 and the antenna 24.

Figure 4:
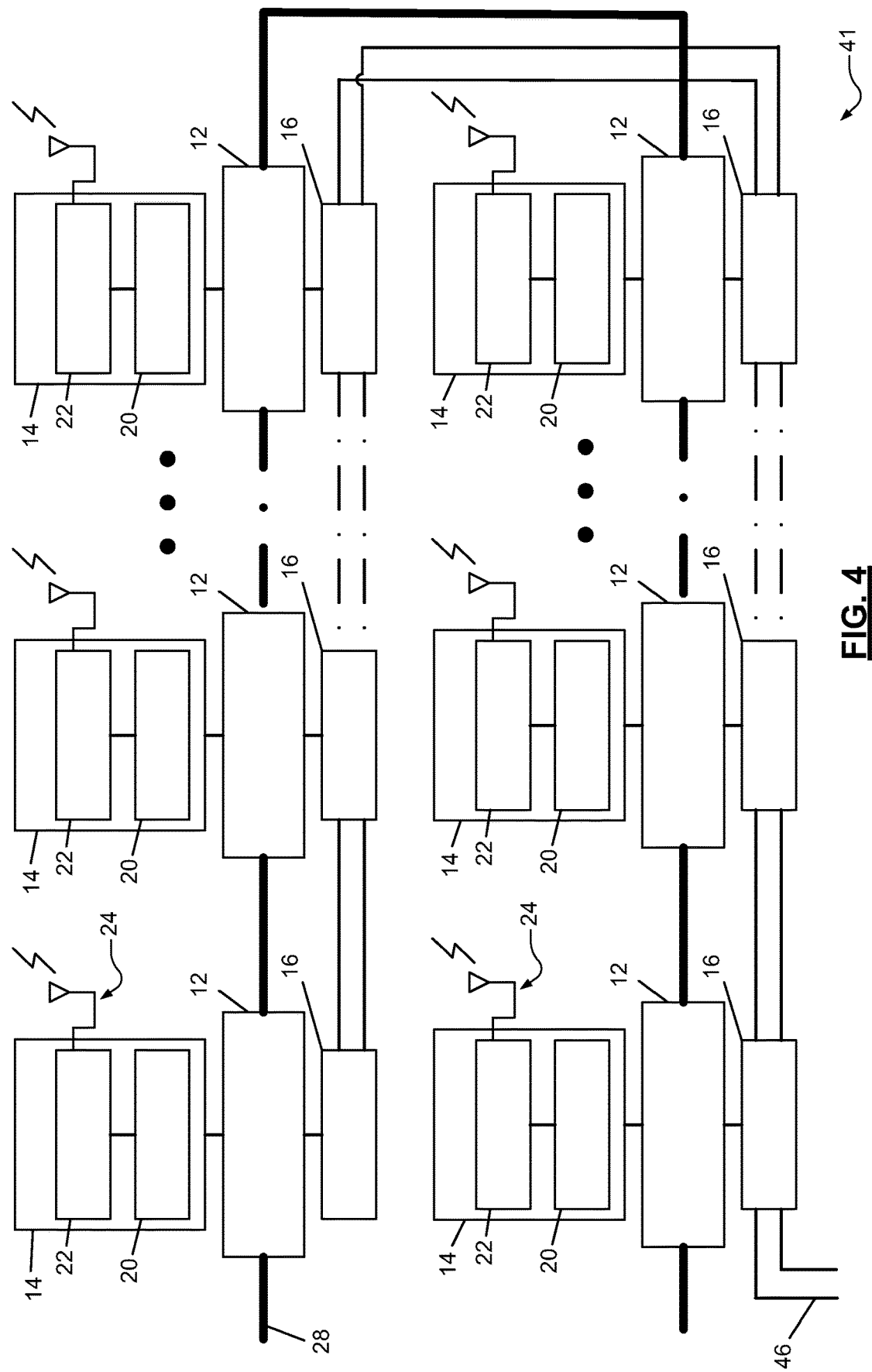
FIG. 4 is a block diagram illustrating a vehicle battery system including multiple DC/DC converters coupled in series with a low voltage bus.

FIG. 4 is a block diagram illustrating a vehicle battery system 41 including multiple DC/DC converters 16 coupled in series with a low voltage bus 46. In the vehicle battery system 41 of FIG. 4, each DC/DC converter 16 is located with a corresponding one of the battery cell modules 12.

For example, each DC/DC converter 16 may be electrically coupled with the battery cell module 12, integrated with the battery cell module 12, etc. In some example embodiments, each DC/DC converter 16 may be electrically coupled with the cell monitor 14, may be integrated with the cell monitor 14, etc.

As shown in FIG. 4, the DC/DC converters 16 are coupled in series with the low voltage bus 46. Although FIG. 4 illustrates six battery cell modules and six DC/DC converters, other embodiments may include more or less battery cell modules 12, more or less DC/DC converters, etc.

Figure 5:
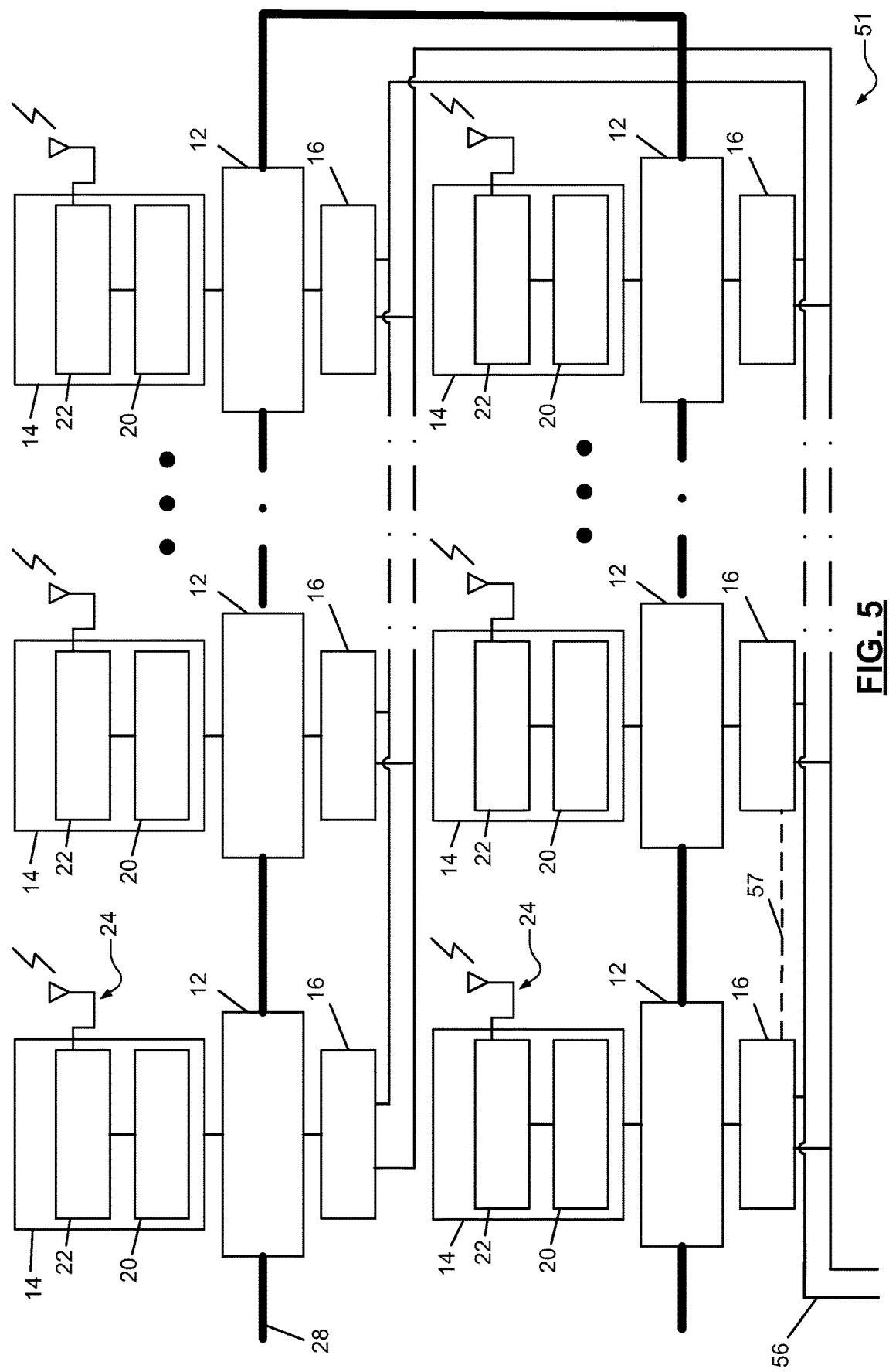
FIG. 5 is a block diagram illustrating a vehicle battery system including multiple DC/DC converters coupled in parallel with a low voltage bus.

FIG. 5 is a block diagram illustrating a vehicle battery system 51 including multiple DC/DC converters 16 coupled in parallel with a low voltage bus 56. The vehicle battery system 51 of FIG. 5 may be similar to the vehicle battery system 41 of FIG. 4, but with the DC/DC coupled in parallel with the low voltage bus 56 instead of in series.

FIG. 5 also illustrates a communication bus 57 coupled between two of the DC/DC converters 16. The communication bus 57 may be coupled between each of the DC/DC converters 16 (or any other suitable wired and/or wired communication may be used), to communicate information about currents supplied by each DC/DC converter 16.

For example, the current information shared on the communication bus 57 may facilitate dynamic current sharing between the multiple DC/DC converters 16. The controller 20 of each cell monitor 14 may be configured to adjust operation of its corresponding one of the DC/DC converters 16, in order to balance current between the multiple DC/DC converters 16.

Figure 6:
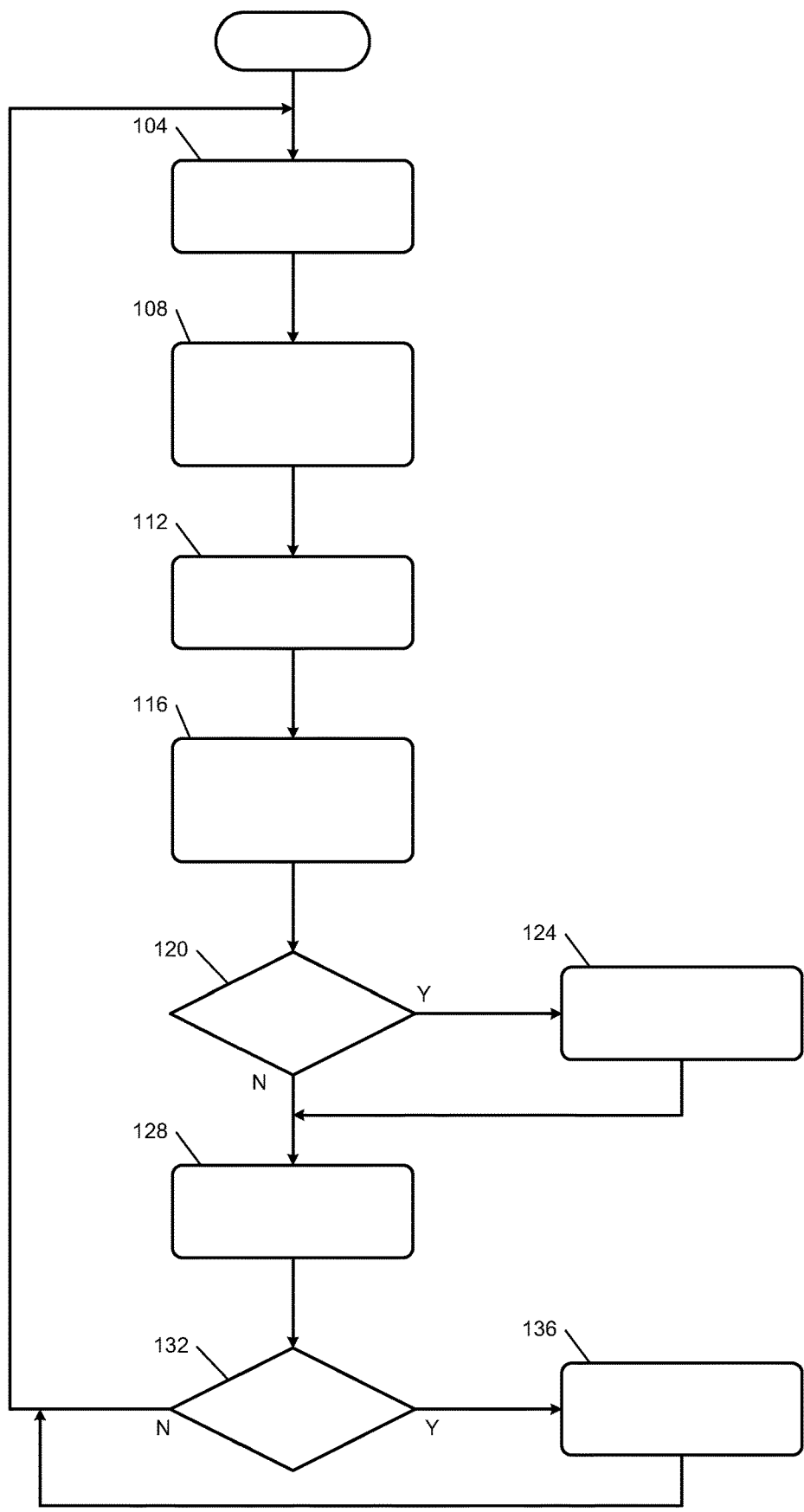
FIG. 6 is a flow chart depicting an example process for controlling DC/DC converters of a vehicle battery system.

FIG. 6 is a flow chart depicting an example process for controlling DC/DC converters of a vehicle battery system. The process may be performed by, e.g., the controller 20 of FIG. 3. For example, the controller 20 may execute the computer-executable instructions 23 to implement steps of the process illustrated in FIG. 6.

At 104, the controller is configured to obtain battery cell parameters, via a cell module interface. For example, the controller 20 of FIG. 3 may be configured to obtain an operation voltage of the battery cell module 12, a current of the battery cell module 12, etc., via the cell module interface 31.

At 108, the controller is configured to wirelessly transmit the battery cell parameters to, e.g., a central controller. For example, the controller 20 of FIG. 3 may be configured to transmit battery cell operation parameters via the transmitter 22 and the antenna 24.

The controller is configured to obtain DC/DC converter parameters at 112, and then to compare the DC/DC converter parameters to a specified set point value at 116. For example, the controller 20 of FIG. 3 may be configured to determine whether a current of a DC/DC converter 16 is within an acceptable current range for the DC/DC converter 16.

At 120, the controller is configured to determine whether the operation parameters of the DC/DC converters are outside of a specified range. For example, if a set point of a DC/DC converter is 12V, the controller may be configured to determine whether the DC/DC converter output is within a range of 11.5 V-12.5 V, within a range of 11.9 V-12.1 V, etc.

If the controller determines at 120 that an operation parameter of the DC/DC converter is outside of a specified range (e.g., an output of the DC/DC converter is only at 7 V when the DC/DC converter is set at 12 V), the controller is configured to adjust an operation setting of the DC/DC converter at 124. Using the above example, the controller may be configured to increase a set point of the DC/DC converter if the current parameter value is below the target value of 12 V. Adjusting operation of the DC/DC converter at 124 may include, for example, increasing or decreasing a switching frequency of the DC/DC converter, a duty cycle of the converter, etc.

After adjusting the operation setting of the DC/DC converter at 124, or determining at 120 that the operation parameters of the DC/DC converter are within the operation parameter range, the controller is configured to obtain current parameters from other DC/DC converters, at 128. For example, the communication bus 57 of FIG. 5 may exchange operation parameters of each DC/DC converter 16 with other DC/DC converters.

At 132, the controller is configured to determine whether currents are imbalanced among the DC/DC converters. For example, if one DC/DC converter is outputting twice as much current as other DC/DC converters, the DC/DC converter may be adjusted to output less current, to dynamically balance the currents of the DC/DC converters.

If the controller determines at 132 that the current among the different DC/DC converters are imbalanced, the controller is configured to adjust a setting of the DC/DC converter to balance the currents at 136. The controller is then configured to return to 104 to obtain updated, more recent operation parameters of the battery cell module. If the controller determines at 136 that the currents among the different DC/DC converters are balanced, the controller returns to 104 to obtain updated, more recent operation parameters of the battery cell module.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery system for a vehicle, the battery system comprising:
    multiple battery cells each configured to store charge for powering an electric vehicle;
    a high voltage bus electrically coupled with the multiple battery cells to provide power to an electric motor of the electric vehicle;
    multiple cell monitoring modules each coupled with a corresponding one of the multiple battery cells, each cell monitoring module including a controller configured to monitor operation parameters of the corresponding one of the multiple battery cells;
    a converter housing;
    multiple DC-DC converters in the converter housing, each DC-DC converter electrically coupled with a corresponding one of the multiple battery cells outside of the converter housing; and
    a low voltage bus electrically connected between the multiple DC-DC converters in the converter housing and at least one vehicle electrical component outside of the converter housing, the low voltage bus configured to provide low voltage power to at least one vehicle electrical component.

2. The battery system of claim 1, wherein the converter housing is a first converter housing, the low voltage bus is a first low voltage bus, and the multiple DC-DC converters are first DC-DC converters, and the battery system further includes:
a second converter housing;
second DC-DC converters in the second converter housing, each second DC-DC converter electrically coupled with a corresponding one of the multiple battery cells outside of the second converter housing; and
a second low voltage bus electrically connected between the second DC-DC converters in the second converter housing and at least one vehicle electrical component outside of the second converter housing, the second low voltage bus configured to provide low voltage power to at least one vehicle electrical component.

3. The battery system of claim 2, wherein:
the first low voltage bus is configured to connect to a different low voltage grid of the electric vehicle than the second low voltage bus; and
a voltage of the low voltage power provided by the first low voltage bus is different than a voltage of the low voltage power provided by the second low voltage bus.

4. The battery system of claim 3, wherein:
the voltage of the low voltage power provided by the first low voltage bus is forty-eight volts; and
the voltage of the low voltage power provided by the first low voltage bus is twelve volts.

5. The battery system of claim 1, wherein the low voltage bus is a first low voltage bus, and the multiple DC-DC converters are first DC-DC converters, and the battery system further includes:
second DC-DC converters in the converter housing, each second DC-DC converter electrically coupled with a corresponding one of the multiple battery cells outside of the converter housing; and
a second low voltage bus electrically connected between the second DC-DC converters and at least one vehicle electrical component, the second low voltage bus configured to provide low voltage power to at least one vehicle electrical component.

6. The battery system of claim 5, wherein a topology of the first DC-DC converters is different than a topology of the second DC-DC converters.

7. The battery system of claim 1, wherein:
a voltage of power provided by the high voltage bus is greater than or equal to sixty volts; and
a voltage of provided by the low voltage bus is less than one quarter of the voltage of the high voltage bus.

8. The battery system of claim 1, further comprising multiple electrical input wires,
wherein each of the multiple electrical input wires is electrically connected between one or more of the multiple battery cells and a corresponding one of the multiple DC-DC converters in the converter housing.

9. The battery system of claim 1, wherein at least two of the multiple DC-DC converters are electrically connected in series to the low voltage bus.

10. The battery system of claim 1, wherein at least two of the multiple DC-DC converters are electrically connected in parallel to the low voltage bus.

11. The battery system of claim 1, further comprising a communication bus coupled between the multiple DC-DC converters to coordinate power sharing between the multiple DC-DC converters.

12. The battery system of claim 1, further comprising at least one thermal management module in the converter housing,
wherein the at least one thermal management module is configured to adjust a temperature of at least one of an interior of the converter housing or the multiple DC-DC converters.

13. A battery system for a vehicle, the battery system comprising:
multiple battery cells each configured to store charge for powering an electric vehicle;
a high voltage bus electrically coupled with the multiple battery cells to provide power to an electric motor of the electric vehicle;
multiple DC-DC converters, each DC-DC converter electrically coupled with a corresponding one of the multiple battery cells;
a low voltage bus configured to provide low voltage power to at least one electrical component of the electric vehicle, each of the multiple DC-DC converters electrically coupled with the low voltage bus; and
multiple cell monitoring modules each coupled with a corresponding one of the multiple battery cells, each cell monitoring module including a controller configured to monitor operation parameters of the corresponding one of the multiple battery cells.

14. The battery system of claim 13, wherein the low voltage bus is a first low voltage bus, and the multiple DC-DC converters are first DC-DC converters, and the battery system further includes:
second DC-DC converters each electrically coupled with a corresponding one of the multiple battery cells; and
a second low voltage bus electrically connected between the second DC-DC converters and at least one vehicle electrical component, the second low voltage bus configured to provide low voltage power to at least one vehicle electrical component.

15. The battery system of claim 13, wherein at least two of the multiple DC-DC converters are electrically connected in series to the low voltage bus.

16. The battery system of claim 13, wherein at least two of the multiple DC-DC converters are electrically connected in parallel to the low voltage bus.

17. The battery system of claim 13, wherein the low voltage bus includes at least one of a bus bar or a cable.

18. The battery system of claim 13, wherein each controller is configured to control operation a corresponding one of the multiple DC-DC converters.

19. The battery system of claim 13, further comprising a communication bus coupled between the multiple DC-DC converters to coordinate power sharing between the multiple DC-DC converters.

20. The battery system of claim 13, wherein:
each DC/DC converter includes a converter control circuit;
each converter control circuit is on a same printed circuit board as the controller of a corresponding cell monitoring module; and
each printed circuit board includes at least one of a planar magnetic core and at least one high frequency switching element.

\* \* \* \* \*